United States Patent [19]

Horiuchi et al.

[11] 4,236,088
[45] Nov. 25, 1980

[54] NOISE-FREE SWITCHING CIRCUIT FOR AND METHOD OF ELECTRONICALLY SELECTING AUDIO INPUT SIGNALS IN AUDIO SYSTEMS

[75] Inventors: Harumi Horiuchi, Yokohama; Hideo Aoyagi, Otashi, both of Japan

[73] Assignee: Soundesign Corp., Jersey City, N.J.

[21] Appl. No.: 933,624

[22] Filed: Aug. 14, 1978

[30] Foreign Application Priority Data

Feb. 8, 1978 [JP] Japan .................................. 53-13266

[51] Int. Cl.$^3$ ............................................. H03K 17/56
[52] U.S. Cl. ..................................... 307/240; 307/243; 307/254; 307/293; 330/124 R
[58] Field of Search ................ 307/243, 240, 293, 254, 307/247 A, 1; 330/124; 358/22, 182; 84/1.26

[56] References Cited

U.S. PATENT DOCUMENTS

| | | | |
|---|---|---|---|
| 2,970,227 | 1/1961 | Horton et al. | 307/243 |
| 3,196,201 | 7/1965 | McDonald | 84/1.26 |
| 3,207,952 | 9/1965 | Brahm | 307/293 |
| 3,472,957 | 10/1969 | Kaye et al. | 358/182 |
| 3,550,016 | 12/1970 | Gugliotti | 307/243 |
| 3,893,038 | 7/1975 | Omata et al. | 330/124 R |

FOREIGN PATENT DOCUMENTS

1420936  1/1976  United Kingdom .................... 358/182

Primary Examiner—Stanley D. Miller, Jr.
Assistant Examiner—B. P. Davis
Attorney, Agent, or Firm—Kirschstein, Kirschstein, Ottinger & Cobrin

[57] ABSTRACT

A noise-free electronic switching circuit selects one of a pair of audio input signals in an audio system. Each input signal is connected by separate conductors to a single output terminal. The output terminals of two transistors are respectively connected between each conductor and ground. When a manually-operated switch is switched to a first operating condition, an exponentially increasing and an exponentially decreasing control voltage are respectively applied to the bases of a first and a second transistor. When the actuating switch is switched to a second operating condition, an exponentially decreasing and an exponentially increasing control voltage are respectively applied to the bases of the first and the second transistor. In either operating condition, one transistor is turned on and the other is turned off. Thus, only the selected audio signal is delivered to the output terminal; and the other non-selected audio signal is shorted to ground before reaching the output terminal. The exponential nature of the control voltages reduces audible noise during switching in accordance with the method of the invention.

14 Claims, 12 Drawing Figures

NOISE-FREE SWITCHING CIRCUIT FOR AND METHOD OF ELECTRONICALLY SELECTING AUDIO INPUT SIGNALS IN AUDIO SYSTEMS

BACKGROUND OF THE INVENTION

1. Field of the Invention

The present invention generally relates to a switching circuit for and a method of electronically selecting between a pair of audio input signals in an audio system and, more particularly, to a noise-free switching circuit operative for reducing audible noise during switching in accordance with the method of the present invention.

2. Description of the Prior Art

It is known in the art of electronic switching circuits to use switching transistors to select one of a pair of audio input signals in an audio system. Conventionally, the control voltage to be applied to the input of each switching transistor in a step voltage. However, the rise and fall time characteristics of such transistors are typically not ideal and, therefore, such transistors having non-linear operating characteristics are not necessarily turned on and off simultaneously with the abrupt changes in voltage level with the step voltage.

Thus, the input step voltage will generate a square wave-like output voltage having overshoot and undershoot, variations which are primary noise-contributing factors in an acoustic system. As is well known, a step or pulse-like waveform of short duration contains frequency components over the complete frequency spectrum, and the frequency components in the audible frequency range generally have a higher amplitude than the frequency components above the audible range. Thus, the overshoot and undershoot voltage variations produce noise which is particularly objectionable and offensive to the ear when generated in an acoustic apparatus.

It is also known in the prior art switching circuits to employ a pair of audio signal-bearing wires to conduct a respective audio signal from a respective input terminal to an output terminal. To effect switching, a manually-operated mechanical switch is electrically connected to both signal-bearing wires. However, separate expensive shielded wiring is required to span the distance between the signal-bearing wires at the interior of an acoustic apparatus and the mechanical switch mounted on the front face of the acoustic apparatus. Moreover, switching performed directly in the signals paths produce very objectionable clicking and hissing noises.

SUMMARY OF THE INVENTION

1. Objects of the Invention

Accordingly, it is the general object of the present invention to overcome the aforementioned drawbacks of the prior art switching circuits.

It is another object of the present invention to substantially reduce the noise level generated during switching in audio systems.

It is still another object of the present invention to eliminate the generation of overshoots and undershoots in electronic switching circuitry.

It is a further object of the present invention to provide an inexpensive noise-free electronic switching circuit and a reliable method of electrically switching between a pair of audio input signals in an audio system.

An additional object of the present invention is to eliminate the use of complex and expensive shielded wiring between a manually-operated switch and a pair of signal-bearing wires in an audio system.

Yet another object of the present invention is to perform electronic switching of audio signals by manually switching a DC power source on or off, rather than by manually switching directly in the audio signal-bearing wires.

2. Features of the Invention

In keeping with these objects and others which will become apparent hereinafter, one feature of the invention resides, briefly stated, in a noise-free switching circuit for and a method of electronically selecting between a pair of audio input signals in an audio system, which comprises first circuit means for establishing electrical communication along a first signal-bearing path between a first input terminal to which one of the audio input signals is applied and an output terminal, and second circuit means for establishing electrical communication along a second signal-bearing path between a second input terminal to which the other of the audio input signals is applied and the same output terminal. The switching circuit further includes a pair of actuatable switching elements or transistors, each being in electrical communication with a respective circuit means, and each being actuatable between a pair of switched states in which transmission of the respective audio input signal along the respective path is permitted and prevented, respectively.

The switching circuit still further includes control means for actuating the switching elements to permit transmission of a selected one of the audio input signals to the output terminal while preventing transmission of the other non-selected audio input signal to the output terminal. The control means includes an actuating switch remote from the signal-bearing paths and having two operating conditions; means responsive to the actuating switch for generating a first control voltage having an amplitude versus time characteristic which increases in smooth continuous manner in one of the operating conditions and which correspondingly decreases in smooth continuous manner in the other of the operating conditions, and for generating a second control voltage having an amplitude versus time characteristic which decreases in smooth continuous manner in said one operating condition and which correspondingly increases in smooth continuous manner in said other operating condition; and means for electrically connecting the control voltages to the switching elements so as to actuate one of the switching elements from one to the other of the switched states, and the other of the switching elements from said other to said one switched state to thereby permit transmission in a gradual noise-free manner of one of the audio input signals along its respective path in one of the operating conditions of the actuating switch, and to thereupon actuate said one switching element from said other to said one switched state, and said other switching element from said one to said other switched state to thereby permit transmission in a gradual noise-free manner of the other of the audio input signals along its respective path in the other of said operating conditions of said actuating switch.

In further accordance with the present invention the control voltage generating means includes an exponential curve generating circuit which generates each control voltage with an amplitude versus time characteristic which increases and decreases in exponential manner, each exponentially increasing and decreasing voltage curve having the same time constant.

Noise in the audible frequency range is thus substantially reduced during switching by employing the above-described exponential control voltages, rather than by employing a step voltage as heretofore taught by the prior art. The smoothly and continuously increasing and/or decreasing exponential curves turns the switching transistors on and/or off in a gradual manner over a predetermined period of time, rather than instantaneously as in the case of the prior art step voltage which has abruptly changes in voltage magnitude. This gradual turn-on and turn-off feature eliminates the above-described overshoot and undershoot drawbacks of the prior art, and thereby significantly reduces the generation of noise due to such voltage variations.

Furthermore, the placement of the actuating switch remote from the signal-bearing paths and, in fact, in electrical connecting relationship with a DC power supply assures that shielded wiring between the switch and the signal wires is not necessary. Moreover, switching now takes place in the DC wiring, rather than directly in the signal paths. Thus, this feature guarantees that the noise level will be even more significantly reduced.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE PREFERRED EMBODIMENTS

Figure 1:
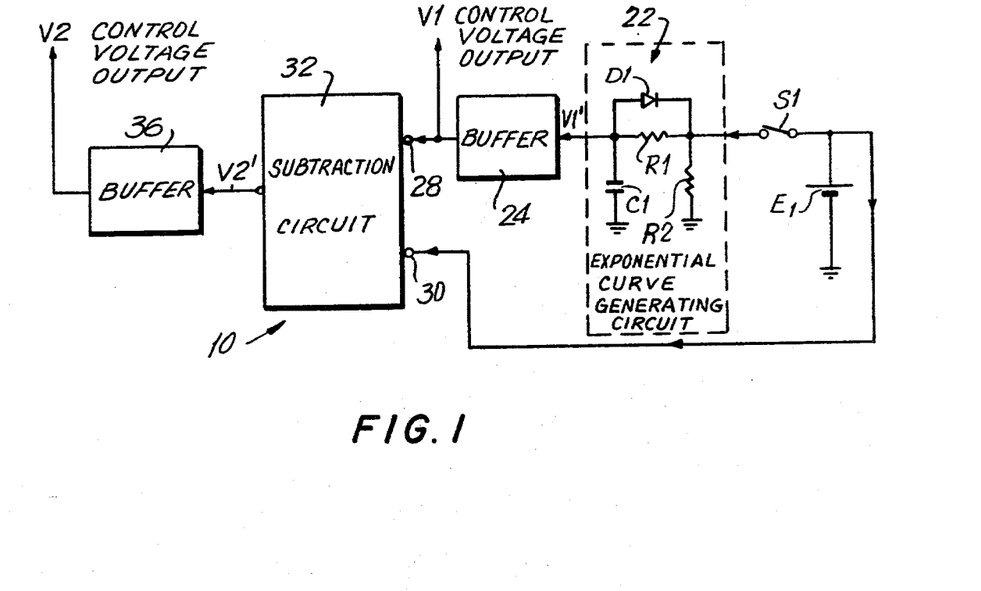
FIG. 1 is a schematic block diagram of the control sub-circuit operative for generating control voltages for the noise-free switching circuit in accordance with the method of the present invention.
Figure 2:
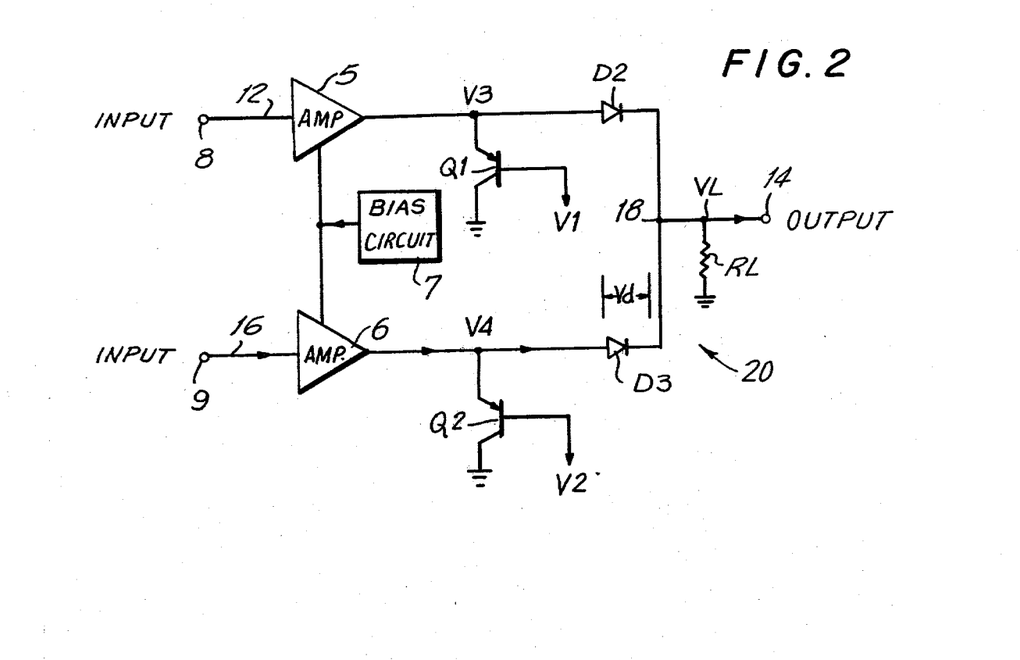
FIG. 2 is a schematic diagram of an embodiment of the switching circuit to be used with the control sub-circuit of FIG. 1.

Referring now to the drawings, numeral 10 in FIG. 1 generally identifies a control sub-circuit operative for generating control voltages $V_1$, $V_2$ which are conducted to the main circuit 20 in FIG. 2. Circuits 10 and 20 together comprise a noise-free switching circuit for electronically selecting between a pair of input signals in accordance with the method of the present invention. For exemplary purposes only, the present invention will be described in connection with the selection of one of a pair of audio input signals in an audio system, although it will be expressly understood that this is being done solely for ease of description. The present invention is not intended to be limited solely to audio systems, nor to the selection of one from two input signals. It will be readily apparent from the following description that the switching circuit and method of the present invention could equally well be applicable to the selection of any number of input signals from among a plurality of such input signals.

Turning now particularly to FIG. 2, the main circuit 20 comprises first circuit means or electrical conductor 12 operative for establishing electrical communication along a first signal-bearing path between a first input terminal 8 to which one of the audio input signals is applied, and an output terminal 14. The main circuit 20 further comprises second circuit means or electrical conductor 16 operative for establishing electrical communication along a second signal-bearing path between a second input terminal 9 to which the other of the audio input signals is applied, and the same output terminal 14. The audio input signals may be derived from any AM and/or FM tuner, tape deck and/or recorder, phono signal or analogous audio source. Amplifiers 5 and 6 are respectively connected to conductors 12 and 16, and a bias circuit 7 is connected in common with both of these amplifiers. Downstream of amplifiers 5 and 6, a pair of actuatable switching elements or PNP transistors $Q_1$, $Q_2$ are electrically connected with the respective outputs of amplifiers 5 and 6. The emitter of PNP transistor $Q_1$ is connected directly to the output of amplifier 5; the collector of transistor $Q_1$ is connected directly to ground; and the base of transistor $Q_1$ is connected to an output labeled $V_1$ of control sub-circuit 10. The emitter of PNP transistor $Q_2$ is connected directly to the output of amplifier 6; the collector of transistor $Q_2$ is connected directly to ground; and the base of transistor $Q_2$ is connected to another output labeled $V_2$ of control sub-circuit 10. The emitter voltages of transistors $Q_1$, $Q_2$ at the outputs of amplifiers 5, 6 are identified by reference characters $V_3$, $V_4$.

Downstream of transistors $Q_1$ and $Q_2$, a pair of isolating diodes $D_2$, $D_3$ are electrically connected to the respective emitters of transistors $Q_1$, $Q_2$. The cathodes of each diode are connected together at a common terminal 18 from which the output load voltage $V_L$ is measured. A load resistor $R_L$ is connected between terminal 18 and ground.

Turning now to FIG. 1, the control sub-circuit 10 comprises a DC power supply source or battery having a DC output voltage of magnitude $E_1$. The positive battery terminal is connected to one side of a manually-operated mechanical switch $S_1$. The other side of the switch $S_1$ is connected in series with an exponential curve generating circuit 22. Circuit 22 comprises a resistor $R_1$ and a diode $D_1$ connected in parallel with each other, a capacitor $C_1$ connected between the anode end of the diode $D_1$ and ground, and a resistor $R_2$ connected between the cathode end of the diode $D_1$ and ground. As will be described in greater detail below, the circuit 22 generates an exponential control voltage $V_1'$ which is conducted to buffer 24. Control voltage $V_1$ is generated at the output of buffer 24.

The control voltage $V_1$ is also conducted to one output 28 of subtraction circuit 32. The other input 30 is electrically connected by conductor 34 to the positive battery terminal. As will be explained in greater detail below, the subtraction circuit 32 is operative for comparing the control voltage $V_1$ with the DC reference voltage $E_1$ to thereby generate a difference control voltage $V_2'$ which is conducted to buffer 36. Control voltage $V_2$ is generated at the output of buffer 36. As noted above, control voltages $V_1$, $V_2$ are respectively fed to the bases of transistors $Q_1$, $Q_2$.

In operation let us assume that the actuating switch $S_1$ is closed at time $t=0$. The DC voltage $E_1$ is applied to circuit 22. Further assuming that the input resistance of the buffer circuit 24 is high enough to be neglected as compared with the resistance of resistor $R_1$, the output voltage $V_1'$ will rise in a smooth continuous exponential manner from zero potential to $E_1$ potential with a time constant $T_1 = R_1 \times C_1$. During this rise, the diode $D_1$ is reverse-biased and non-conductive. Also, resistor $R_2$ is at $E_1$ potential and therefore $R_2$ does not affect time constant $T_1$.

When the switch $S_1$ is subsequently opened at time $t = t_1$ when the voltage $V_1'$ is at the stabilized value $E_1$, the diode $D_1$ becomes forward-biased due to the higher voltage which exists at the anode end of the diode $D_1$. The conducting diode $D_1$ provides a bypass path around resistor $R_1$. If the input resistance of the buffer circuit 24 is high enough to be neglected as compared with the resistance of resistor $R_2$, then the output voltage $V_1'$ will fall in a smooth continuous exponential manner from $E_1$ potential to zero potential with a time constant $T_2 = R_2 \times C_1$.

To simplify the following description, it is assumed that the voltage gain of buffer circuit 24, which is operative for preventing external factors from affecting circuit 22, is unity and that the buffer introduces no DC level shift. Consequently $V_1 = V_1'$ and the subtraction circuit will generate a difference signal $V_2' = E_1 - V_1$. Again, assuming that the buffer circuit 36 is identical to buffer circuit 24, then $V_2 = V_2'$ and $V_2 = E_1 - V_1$.

Figure 3:
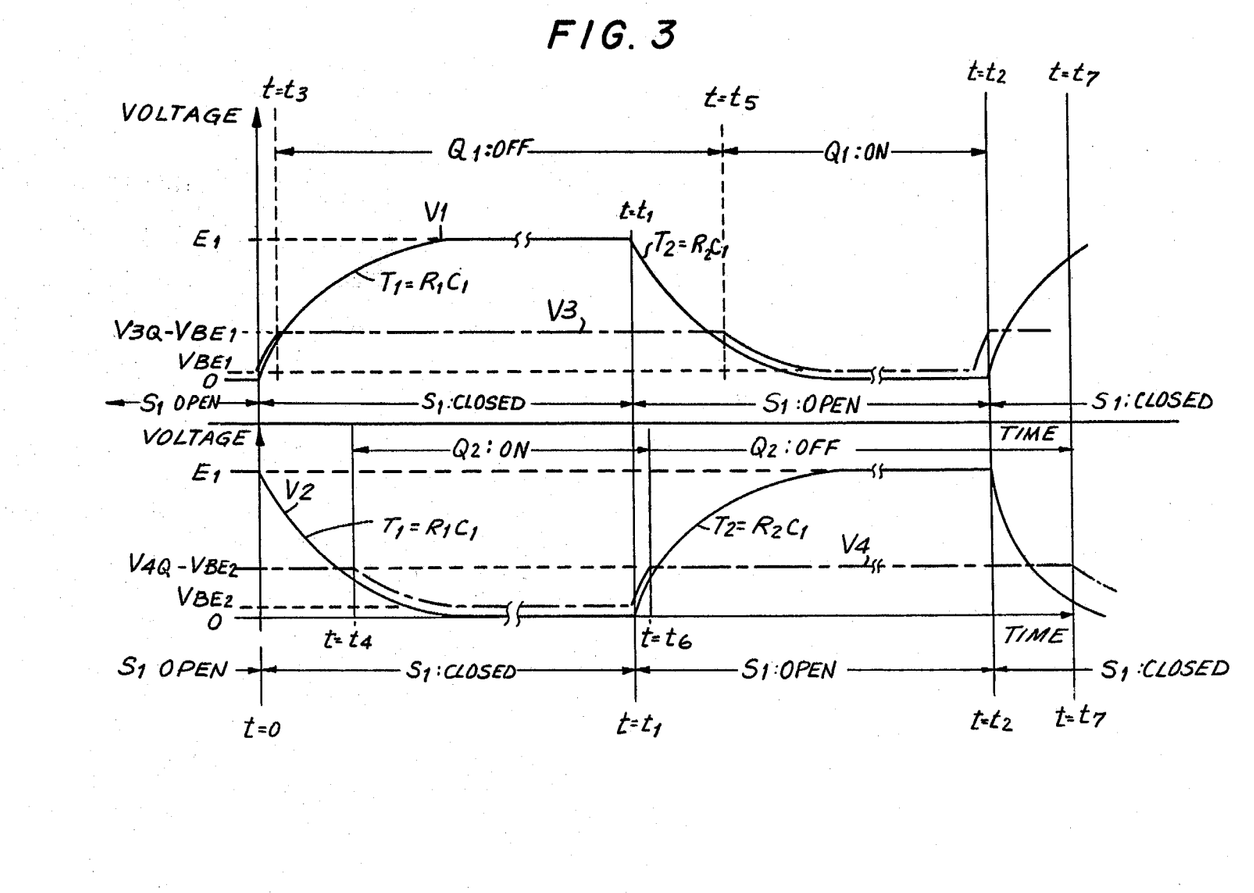
FIG. 3 is a voltage versus time representation of the operation of the switching circuit of FIGS. 1 and 2.

As best shown in FIG. 3, the control voltage $V_1$ at t seconds after the switch $S_1$ has been closed is represented by the known equation:

$$V_1 = E_1 - E_1 \cdot \epsilon^{-t/T_1} \quad (\epsilon: \text{natural logarithm})$$

Moreover, the control voltage $V_1$ after the switch $S_1$ has been opened is represented by the known equation:

$$V_1 = E_1 \cdot \epsilon^{-t/T_2}$$

On the other hand, the control voltage $V_2$, which is the difference of voltage $E_1$ and control Voltage $V_1$, can be represented as follows:

With $S_1$ closed:

$$V_2 = E_1 - V_1 = E_1 - (E_1 - E_1 \cdot \epsilon^{-t/T_1}) = E_1 \cdot \epsilon^{-t/T_1}$$

With $S_1$ open:

$$V_2 = E_1 - V_1 = E_1 - E_1 \cdot \epsilon^{-t/T_2}$$

The above equations have been plotted in FIG. 3, wherein it can be clearly seen that when switch $S_1$ is closed, then the voltage $V_1$ rises exponentially at time constant $T_1$, and voltage $V_2$ falls exponentially at time constant $T_1$. Moreover, when switch $S_1$ is opened, then the voltage $V_1$ falls exponentially at time constant $T_2$, and voltage $V_2$ rises exponentially at time constant $T_2$. For convenience of explanation, it is now assumed that resistor $R_1$ and resistor $R_2$ have the same resistance and that the time constant $T = T_1 = T_2$.

Referring against to FIG. 2, the above-described exponential control voltages $V_1$ and $V_2$ are fed to transistors $Q_1$ and $Q_2$. Let us assume that transistor $Q_1$ is on and that transistor $Q_2$ is off prior to time $t = 0$. The control voltage $V_1$ is at zero (low) potential, and the emitter voltage $V_3$ of transistor $Q_1$ is approximately at zero potential, and specifically is at $V_{BE1}$ (voltage across the base-emitter junction). This low control voltage and low emitter voltage shorts the audio input signal passing through amplifier 5 directly to ground.

In other words, the audio input signal passing through amplifier 5 is prevented from reaching output terminal 14. At the same time, the control voltage $V_2$ is at $E_1$ (high) potential, and the emitter voltage $E_4$ of transistor $Q_2$ is at a predetermined potential less than $E_1$. This relatively high control voltage and emitter voltage turns transistor $Q_2$ fully off so that the audio input signal passing through amplifier 6 is not diverted to ground, but instead passes directly through diode $D_3$ and thereupon to output terminal 14.

The output voltage $V_L$ is a value which is lower than voltage $V_4$ by forward voltage $V_d$ of diode $D_3$. The diode $D_2$ is reverse-biased by voltage $V_L$ and becomes non-conductive. Thus, the signal applied to terminal 8 is certainly cut off and isolated from the signal applied to terminal 9.

If the relationship between voltage $V_1$ and voltage $V_2$ were reversed, then the switching states of transistors $Q_1$ and $Q_2$ would be reversed, and the input signal applied to terminal 8 would be switched to output terminal 14, rather than the input signal applied to terminal 9. For further descriptive purposes, the voltage $V_3$ when the signal from terminal 8 passes to the load is $V_{3Q}$, and the voltage $V_4$ when the signal from terminal 9 passes to the load is $V_{4Q}$.

Now, assume that the switch $S_1$ is closed at time $t = 0$. The voltage $V_1$ rises exponentially until it eventually stabilizes at $E_1$ potential. During this period, when $V_1$ approximately reaches the voltage level $V_{3Q} - V_{BE1}$, the transistor $Q_1$ which had been turned on is now cut off at time $t = t_3$. The voltage $V_3$ follows the rise of voltage $V_1$ from $V_{BE1}$ potential until, when $V_3 = V_{3Q} - V_{BE1}$ at time $t = t_3$, the transistor $Q_1$ is cut off, and the voltage $V_3$ remains constant at $V_{3Q} - V_{BE1}$ potential.

After switch $S_1$ is closed, the voltage $V_2$ falls exponentially from $E_1$ potential until it reaches zero potential. During this period, when $V_2$ approximately reaches the voltage $V_{4Q} - V_{BE2}$, transistor $Q_2$ which had been cut off is now turned on at time $t = t_4$. The transistor $Q_2$ becomes active temporarily (enters the operating region) and then saturates. When voltage $V_2$ becomes zero, and the transistor $Q_2$ becomes completely saturated, then the voltage $V_3$ is attributable to $V_{BF2}$ alone.

Now, assume that the switch $S_1$ is opened at time $t = t_1$, then the voltage $V_1$ falls exponentially to zero. During this period, when $V_1$ approximately reaches the voltage $V_{3Q}-V_{BE1}$, then the transistor $Q_1$ which had been cut off is now turned on at time $t=t_5$. Transistor $Q_1$ first enters the active region and then fully saturates. Voltage $V_3$ also falls exponentially from the $V_{3Q}-V_{BE1}$ potential to $V_{BE1}$ when voltage $V_1$ becomes zero.

After switch $S_1$ is opened, the voltage $V_2$ rises exponentially from zero potential until it eventually stabilizes at $E_1$ potential. During this period, when $V_2$ approximately reaches the voltage $V_{4Q}-V_{BE2}$, then the transistor $Q_2$ which had been turned on is now cut off at time $t=t_6$. After $t=t_6$, the voltage $V_4$ remains constant at $V_{4Q}-V_{BE2}$ potential.

In the event that a user wishes to close the switch $S_1$ again at time $t=t_2$, then the switching circuit will repeat the cycle of operation described above. As a first approximation, the forward voltage drop $V_d$ of diodes $D_2$ and $D_3$ approximately equals the respective base-emitter voltages $V_{BE1}$ and $V_{BE2}$ of the transistors $Q_1$ and $Q_2$.

From FIG. 3, it will be readily seen that transistor $Q_1$ is off between time $t=t_3$ and time $t=t_5$, that transistor $Q_1$ is on between time $t=t_5$ and time $t=t_2$, that transistor $Q_2$ is on between time $t=t_4$ and time $t=t_6$, and that transistor $Q_2$ is off between time $t=t_6$ and time $t=t_7$. Furthermore, it will be observed that transistor $Q_2$ is on for at least part of the time that transistor $Q_1$ is off; that transistors $Q_1$ and $Q_2$ are simultaneously off for a predetermined time period between time $t=t_6$ and time $t=t_5$; and that transistor $Q_1$ is on for at least part of the time that transistor $Q_2$ is off.

In accordance with the present invention, the exponential rising and falling control voltages turn the transistors $Q_1$ and $Q_2$ on and/or off in a gradual manner over a predetermined period of time, rather than instantaneously as with step voltage which have abrupt changes in magnitude.

Figure 4A:
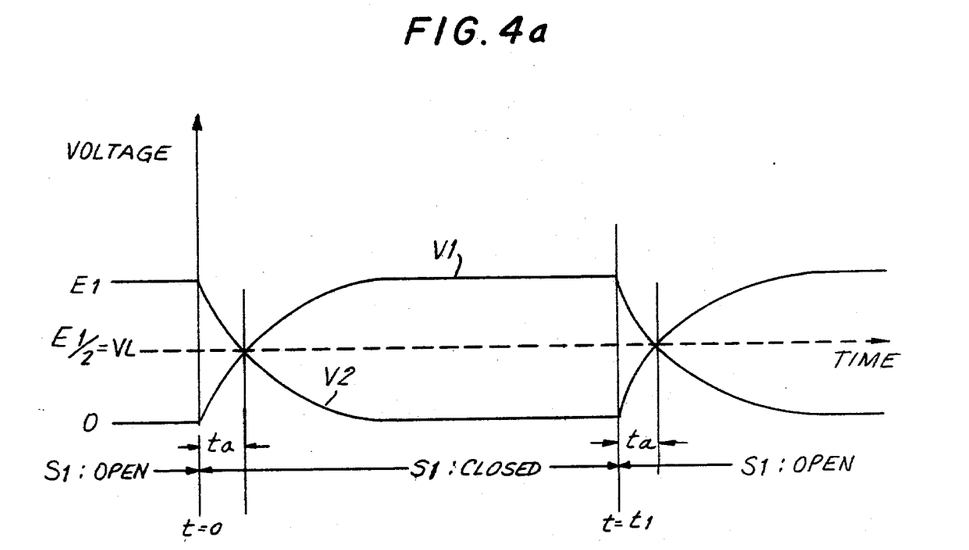
FIG. 4(a) is a superimposed voltage versus time representation of control voltages $V_1$ and $V_2$ on a single graph for $V_L = E/2$.

The output voltage waveform $V_L$ is, of course, dependent upon the timing when the transistors are turned on and off. FIG. 4(a) shows the control voltages $V_1$ and $V_2$ superimposed on a single voltage versus time graph. Since voltages $V_1$ and $V_2$ have the same time constant T, they ideally intersect each other at a point where $V_1=V_2=0.5E_1$, that is, $t_a$ seconds after the switch has been closed or opened, respectively. Assuming that output voltage $V_L=E_1/2$ then switching action between the two audio input signals is carried out after $t_a$ seconds have elapsed upon closing or opening switch $S_1$.

Figure 4B:
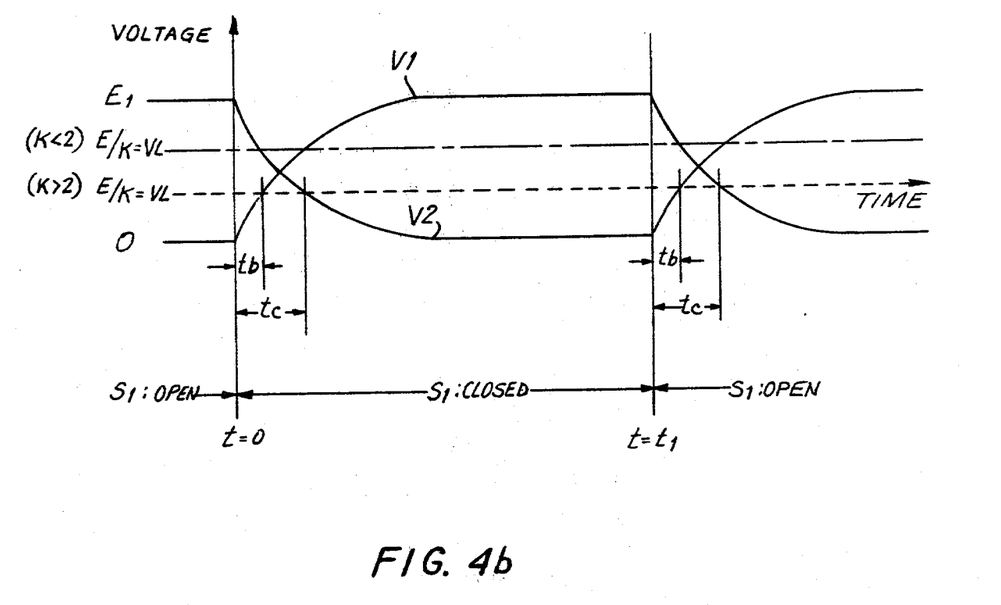
FIG. 4(b) is a superimposed voltage versus time representation of control voltages $V_1$ and $V_2$ on a single graph for $V_L = E/K$ ($K > 2$)

If the voltage $V_L$ is not exactly equal to $E_1/2$, then the timing of this switching action is different. If voltage $V_L$ is less than $E_1/2$ as shown in FIG. 4(b), then voltage $V_1$ reaches voltage $V_L$ after $t_b$ seconds have elapsed after closing the switch. After $t_c$ seconds have elapsed, transistor $Q_1$ turns off and transistor $Q_2$ turns on. After opening the switch at $t=t_1$, transistor $Q_2$ turns off after $t_b$ seconds, and transistor $Q_1$ turns on after $t_c$ seconds. In the time interval $t_c-t_b$ seconds, input signals from both input signals 8 and 9 are being conducted to the output 14. During this time interval, cross-talk may exist until switching is completed. If the voltage $V_L$ is greater than $E_1/2$ as also shown in FIG. 4(b), then one of the transistors is still on while the other is switched from off to on in a manner analogous to that described above.

Figure 5A:
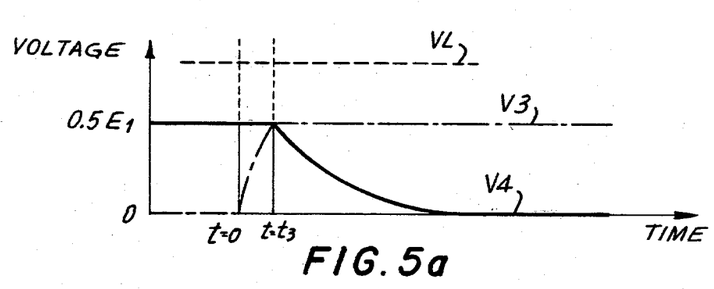
FIG. 5(a) is a superimposed voltage versus time representation of switching voltages $V_3$ and $V_4$ and load voltages $V_L$ on a single graph for $V_3 = V_4 = 0.5E$.

Turning now to FIG. 5(a), the voltages $V_3$, $V_4$, and $V_L$ are superimposed on a single voltage versus time graph. Assuming that $V_3=V_4=0.5E_1$ and that $V_{BE1}=V_{BE2}=0$, then $V_3$ and $V_4$ vary as shown in FIG. 5(a) when the control voltages $V_1$ and $V_2$ are applied to transistors $Q_1$ and $Q_2$ in the manner shown in FIG. 4(a). Briefly recapitulating the previous analysis, at $t=0$, $V_1=0$, transistor $Q_1$ is turned on, and $V_3=0$. Furthermore at $t=0$, $V_2=E_1$, transistor $Q_2$ is turned off, and therefore $V_4=0.5E_1$. Between time $t=0$ and time $t=t_3$, $V_1$ gradually increases, and the impedance of transistor $Q_1$ gradually increases until $V_1$ reaches $0.5E_1$. At time $t=t_3$, transistor $Q_2$ is turned off and $V_3=0.5E_1$. Transistor $Q_2$ is kept off until voltage $V_2$ reaches $0.5E_1$ since the base-emitter voltage is reverse-biased. When voltage $V_2$ is lower than $0.5E_1$, transistor $Q_1$ begins to conduct so that voltage $V_4$ gradually decreases to zero after time $t=t_3$.

Inasmuch as voltage $V_4$ has a constant level up to time $t=t_3$, and inasmuch as voltage $V_3$ has a constant level after time $t=t_3$, the output voltage $V_L$ has a constant magnitude, as shown in FIG. 5(a).

Figure 5B:
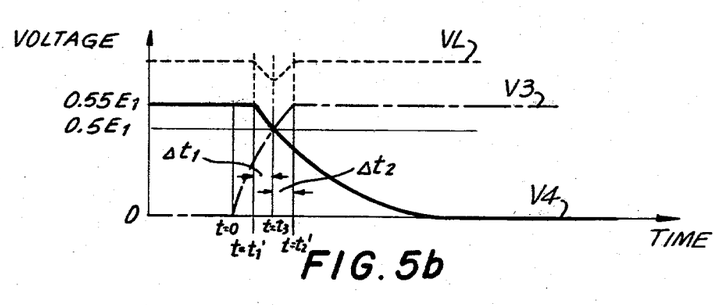
FIG. 5(b) is a superimposed voltage versus time representation of switching voltages $V_3$ and $V_4$ and load voltage $V_L$ on a single graph for $V_3 = V_4 = 0.55E$.
Figure 5C:
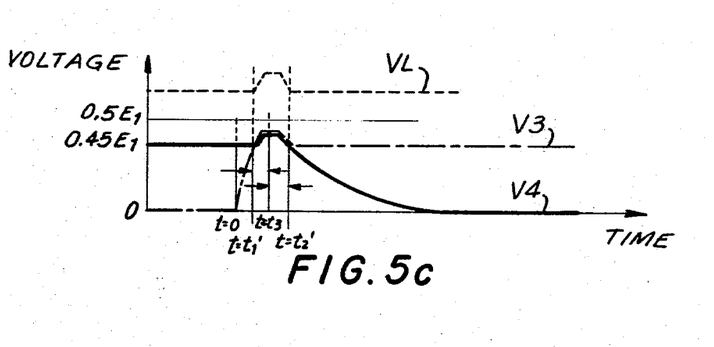
FIG. 5(c) is a superimposed voltage versus time representation of switching voltages $V_3$ and $V_4$ and load voltage $V_L$ on a single graph for $V_3 = V_4 = 0.45E$.

Of course FIG. 5(a) represents an ideal situation. In practice, where the above-described circuitry is fabricated as an IC circuit chip, manufacturing tolerances on the order of 10% for the various resistors and tolerances on the order of 20% for the transistors are common. Let us therefore assume that the anticipated tolerance range will cause the voltages $V_3$ and $V_4$ to vary 10% from a lower limit of $V_3=V_4=0.45E_1$ to an upper limit of $V_3=V_4=0.55E_1$. FIG. 5(b) shows the $V_3$, $V_4$, $V_L$ voltage variation for the upper limit case; and FIG. 5(c) shows the $V_3$, $V_4$, $V_L$ variation for the lower limit case.

Briefly recapitulating the above analysis, at $t=0$, $V_1=0$, $V_3=0$, $V_2=E_1$, and $V_4=0.55E_1$. $V_3$ gradually increases until transistor $Q_1$ is turned off when $V_1$ reaches the emitter voltage of transistor $Q_1$ which is $0.55E_1$. $V_1$ takes a longer time $t=t_2'$ than $V_2$ to arrive at the $0.55E_1$ level. On the other hand, transistor $Q_2$ is kept off until $V_1$ reaches the $0.55E_1$ level so that voltage $V_4$ remains constant at this level until time $t=t_1'$.

The output voltage waveform $V_L$ for the upper limit case has a constant magnitude except in the transition region wherein a depression appears. The shape of this depression could be described as V-shaped whose bottom is rounded due to the non-ideal rise and fall time characteristics of the switching diodes.

This generally U-shaped depression has a very low harmonic frequency. For example, if $t_1'=0.13152$ seconds, and $t_2'=0.17567$ seconds, and if $T=220$ ms, and assume that the U-shaped depression is a half wave of a sine wave, then the frequency can be calculated as follows:

$$f = \frac{1}{T} = \frac{1}{2(t_2'-t_1')} = 11.3 \text{ Hz}$$

This frequency is clearly out of the audio frequency range and would not be heard by a listener.

As for FIG. 5(c), voltage $V_1$ takes a shorter time to reach $0.45E_1$, and therefore transistor $Q_1$ is turned off at time $t=t_1'$. Voltage $V_3$ appears as $V_L$ after $t=t_1'$. Voltage $V_2$ takes a longer time to reach $0.45E_1$, and therefore voltage $V_4$ appears until time $t=t_2'$. Between time $t=t_1'$ and time $t=t_2'$, voltages $V_3$ and $V_4$ are simultaneously fed as $V_L$ to the output. This means that the output voltage waveform will be constant except in the transition region wherein a bump appears, as best shown in FIG. 5(c).

To help understand why the voltage increases in the transition region, one must look back towards the transistors from output terminal 18. In this case the transistor $Q_1$ could be replaced by voltage generator $V_3$ with an internal impedance R, and transistor $Q_2$ could be replaced by a voltage generator $V_4$ with an internal impedance R. The voltage across the load resistor before $t_1'$ when only $V_4$ is connected across $R_L$ is:

$$V_L = \frac{R_L}{R + R_L} V_4$$

The voltage across the load resistor from $t_1'$ to $t_2'$ when both voltages $V_3$ and $V_4$ are connected across $R_L$ is:

$$V_L = \frac{R_L}{\frac{R}{2} + R_L} V_4$$

The voltage across the load resistor after $t_2'$ when only voltage $V_3$ is connected across $R_L$ is:

$$V_L = \frac{R_L}{R + R_L} V_3$$

Therefore, $V_L$ is increased during the transition region from $t_1'$ to $t_2'$. The aforementioned bump could also be described as a trapezoid with rounded corners due to the non-ideal rise and fall time characteristics of the switching diodes. The bump voltage variation can be corrected by making $R_L$ much greater than R. In this case, $V_L = V_4 = V_3$. Thus, by making $R_L$ much greater than R, the bump is flattened out and no objectionable noise will be heard by the listener.

Figure 6:
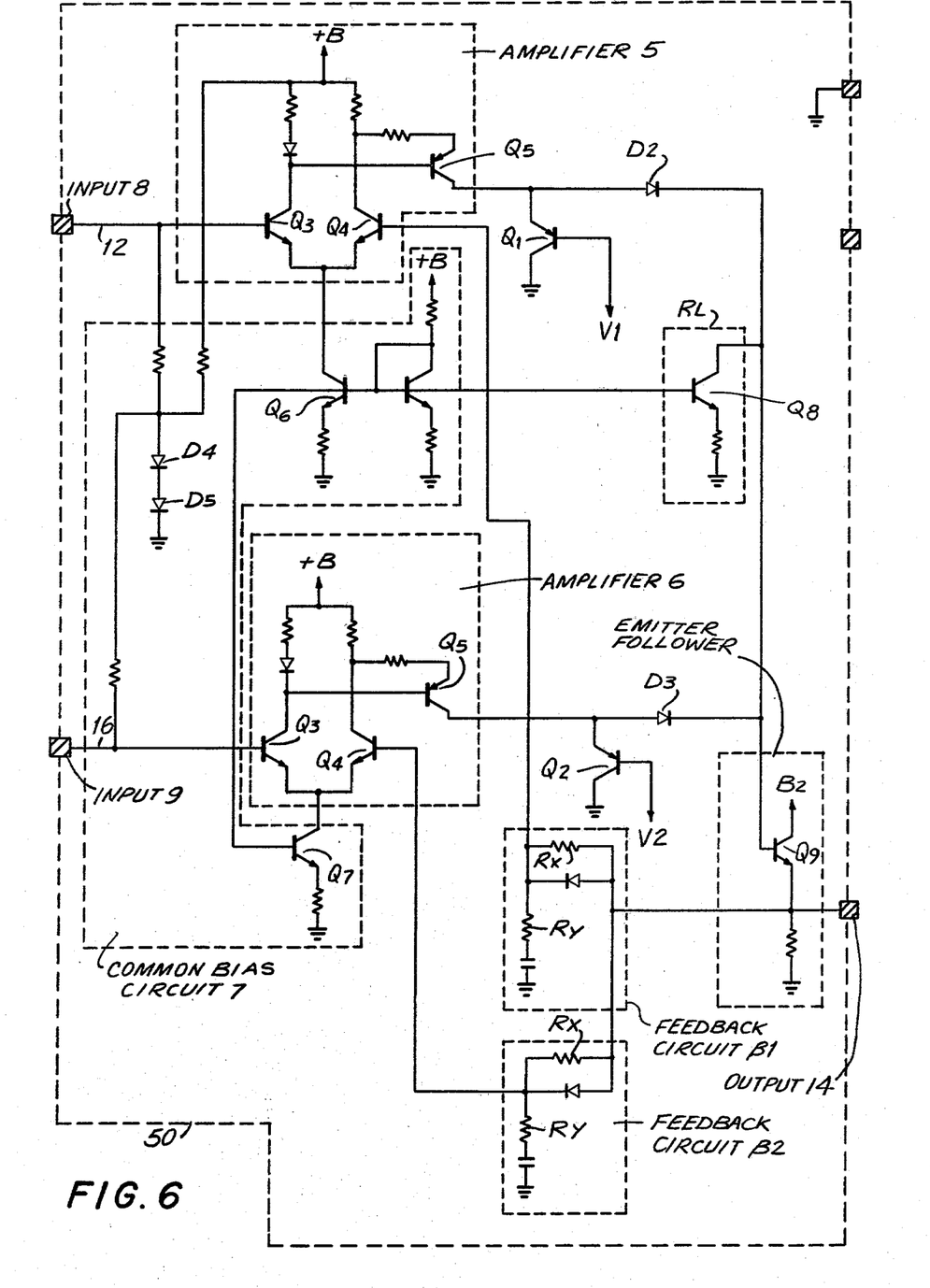
FIG. 6 is a circuit diagram showing a preferred manner of implementing the embodiment of the switching circuit diagram of FIG. 2.

Turning now to FIG. 6, input terminals 8 and 9, conductors 12 and 16, amplifiers 5 and 6, transistors $Q_1$ and $Q_2$, diodes $D_2$ and $D_3$ and bias circuit 7 are clearly marked and are analogous to the corresponding parts of the block diagram of FIG. 2. The dashed line border 50 which surrounds the circuitry of FIG. 6 diagrammatically represents an integrated circuit chip on which the aforementioned components are fabricated.

In this preferred embodiment, each amplifier includes transistor $Q_3$ and transistor $Q_4$ which together comprise a differential input amplifier. Transistor $Q_5$ is an isolation buffer transistor. The common bias circuit 7 is a conventional constant current biasing circuit. Transistor $Q_6$ biases amplifier 5, and transistor $Q_7$ biases amplifier 6. Diodes $D_4$ and $D_5$ are input biasing diodes operative for keeping the voltage on the respective bases of transistors $Q_3$, $Q_3$ constant and also for maintaining the quiescent operating point stable. The diodes $D_4$ and $D_5$ could also be replaced by a single external capacitor. However, in this latter case, an additional terminal on the circuit chip would have to be provided.

Various modifications have been incorporated into the FIG. 6 circuitry which are not present in the FIG. 2 circuitry. For example, the load resistor $R_L$ has been replaced by transistor $Q_8$ which serves as a constant current source load, and also serves to increase the voltage gain. An emitter follower transistor $Q_9$ has been added to provide a low output impedance at output terminal 14. Finally, conventional feedback circuits $\beta_1$ and $\beta_2$ have been added between the output terminal 14 and the amplifiers 5 and 6 to thereby serve as gain controllers and to keep the output level constant. At high frequencies, the feedback will be $R_y/(R_y + R_x)$ so that the amplifier gain is increased at high frequencies.

Figure 7:
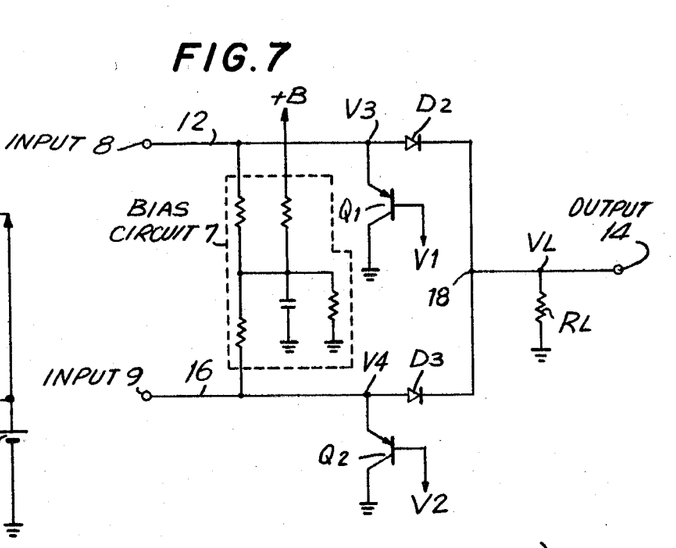
FIG. 7 is a schematic diagram analogous to FIG. 2 with the amplifiers removed.

Turning now to FIG. 7, this circuit is identical to the circuit of FIG. 2, except that the amplifiers 5 and 6 have been removed. In this embodiment no amplifiers are necessary, and the common bias circuit 7 is operative to properly bias the diodes $D_2$ and $D_3$ at a suitable operating point.

Figure 8:
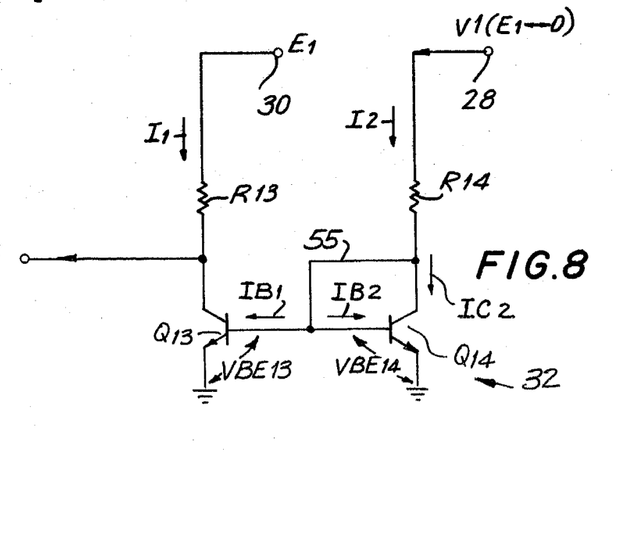
FIG. 8 is a circuit diagram showing a preferred manner of implementing the subtraction sub-circuit of FIG. 1.

The subtraction circuit 32 of FIG. 1 is shown in detail in FIG. 8. The circuit 32 or so-called current mirror circuit comprises transistors $Q_{13}$ and $Q_{14}$ whose bases are connected together, whose emitters are connected to ground, and whose collectors are respectively connected through resistors $R_{13}$ and $R_{14}$ to input terminals 30 and 28. Bypass conductor 55 is connected between the collector and the base of transistor $Q_{14}$. Collector currents $I_1$ and $I_2$ flow through resistors $R_{13}$ and $R_{14}$, respectively; base currents $I_{B1}$ and $I_{B2}$ flow into the respective bases of transistors $Q_{13}$ and $Q_{14}$; and voltages $V_{BE13}$ and $V_{BE14}$ are measured across the base-emitter junctions of transistors $Q_{13}$ and $Q_{14}$, respectively.

In operation, the switching circuit makes $I_1 = I_2$ regardless of the value of voltage $V_1$. Therefore, so long as the voltages $V_1$ and $V_2'$ are within a range in which $V_{BE13}$ and $V_{BE14}$ are negligible, the following equations hold true:

$$I_2 \simeq \frac{V_1}{R_{14}} \simeq I_1$$

$$V_2' \simeq E_1 - I_1 \cdot R_{13} = E_1 - \frac{V_1}{R_{14}} \cdot R_{13}$$

If $R_{13} = R_{14}$, then
$V_2' \simeq E_1 - V_1$

If $V_1$ is close to zero potential, then the base-emitter voltages cannot be neglected, and then the above equations do not hold. However, as a practical matter, voltage $V_2'$ lies within a range such that the base-emitter voltages can be neglected. Thus, no practical problem is involved. Conversely, as voltage $V_1$ approaches $E_1$, transistor $Q_{13}$ approaches its saturated region. This prevents the collector voltage $V_2'$ from decreasing below the collector saturation voltage. As described above, this can also be neglected as a practical matter.

Figure 9:
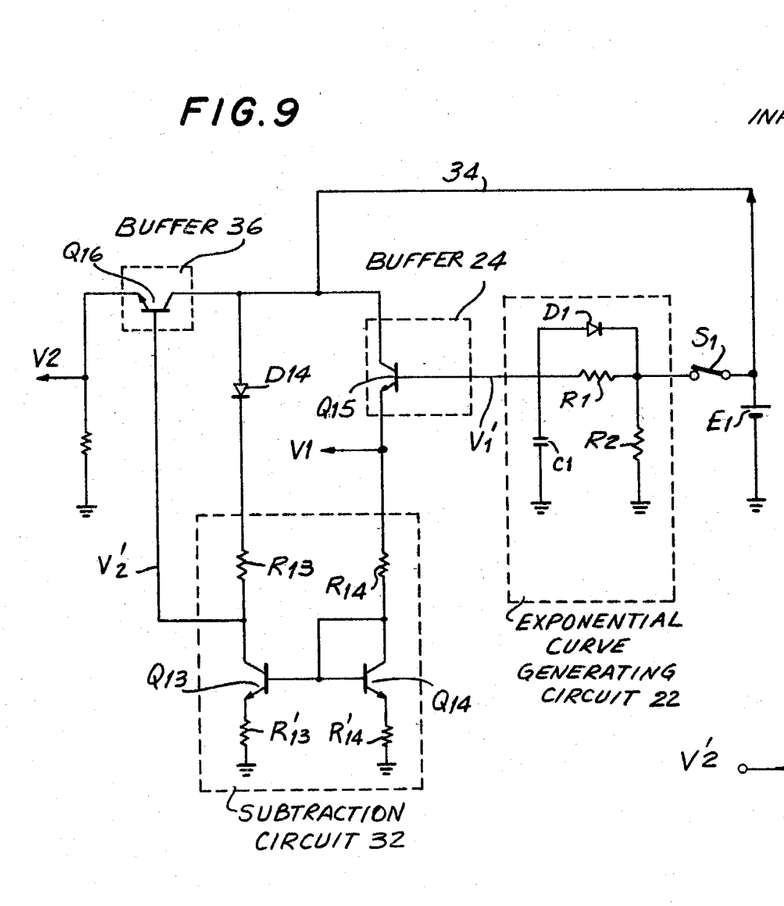
FIG. 9 is a circuit diagram showing a preferred manner of implementing the control sub-circuit of FIG. 1 with the subtraction sub-circuit of FIG. 8.

Turning finally to FIG. 9, the circuitry is analogous to the block diagram of FIG. 1. The subtraction circuit 32 is generally identical to that described in FIG. 8, except that equal small resistors $R_{13}'$ and $R_{14}'$ have been inserted in the emitters to improve linearity. Buffer amplifier 24 has been embodied by isolating transistor $Q_{15}$, and buffer amplifier 36 has been embodied by isolating transistor $Q_{16}$. Diode $D_{14}$ has been inserted to compensate and to correct for the base-emitter voltage of transistor $Q_{15}$.

In accordance with this invention, it is possible to significantly decrease switching noise which occurs in prior art constructions when conventional step-control signals are employed. The circuit and method of the present invention switches input signals electronically in a gradual manner by applying to the switching elements control signals which have a predetermined time constant. When applied to acoustic systems that handle audible frequencies, the present invention eliminates noise offensive to the ear. In addition, the circuit can be integrated easily in an IC chip for uniform and standardized operation.

It will be understood that each of the elements described above, or two or more together, may also find a useful application in other types of constructions differing from the types described above.

While the invention has been illustrated and described as embodied in NOISE-FREE SWITCHING CIRCUIT FOR AND METHOD OF ELECTRONICALLY SELECTING AUDIO INPUT SIGNALS IN AUDIO SYSTEMS, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims:

1. A noise-free switching circuit for electronically selected between a pair of audio input signals in an audio system, comprising:
   (a) first circuit means for establishing electrical communication along a first signal-bearing path between a first input terminal to which one of the audio input signals is applied, and an output terminal;
   (b) second circuit means for establishing electrical communication along a second signal-bearing path between a second input terminal to which the other of the audio input signals is applied, and the same output terminal;
   (c) switching means including a pair of actuatable switching elements each being in electrical communication with a respective circuit means, and each being actuatable between a pair of switched states in which transmission of the respective audio input signal along the respective path is permitted and prevented, respectively; and
   (d) control means for actuating said switching elements to permit transmission of a selected one of the audio input signals to the output terminal while preventing transmission of the other non-selected audio input signal to the output terminal, said control means including
   (i) an actuating switch remote from said signal-bearing paths and having two operating conditions,
   (ii) means responsive to said actuating switch for generating a first control voltage having an amplitude versus time characteristic which increases in smooth continuous manner in one of said operating conditions and which correspondingly decreases in smooth continuous manner in the other of said operating conditions, and for generating a second control voltage having an amplitude versus time characteristic which decreases in smooth continuous manner in said one operating condition and which correspondingly increases in smooth continuous manner in said other operating condition, said first and said second control voltages being generated substantially simultaneously and in inverse relationship with each other, and
   (iii) means for electrically connecting said control voltages to said switching elements so as to gradually begin to actuate one of the switching elements from one to the other of said switched states, and to simultaneously begin to gradually deactuate the other of the switching elements from said other to said one switched state to thereby permit transmission in a gradual noise-free manner of one of the audio input signals along its respective path in one of said operating conditions of said actuating switch, and to thereupon gradually begin to deactuate said one switching element from said other to said one switched state, and to simultaneously begin to gradually actuate said other switching element from said one to said other switched state to thereby permit transmission in a gradual noise-free manner of the other of the audio input signals along its respective path in the other of said operating conditions of said actuating switch.

2. The noise-free switching circuit as defined in claim 1, wherein said first and said second circuit means each includes an amplifier in its respective path for amplifying the magnitude of the respective audio input signal.

3. The noise-free switching circuit as defined in claim 2; and further comprising a common bias circuit operatively electrically connected to and operative for biasing each amplifier.

4. The noise-free switching circuit as defined in claim 1, wherein said first and said second circuit means each includes a diode in its respective path for isolating the respective paths from each other.

5. The noise-free switching circuit as defined in claim 1, wherein each switching element has a first terminal electrically connected to a respective circuit means, a second terminal electrically connected to ground, and a third control terminal electrically connected to said control voltage generating means to thereby establish and disestablish electrical communication between said first terminal and said second terminal in respective operating conditions of said actuating switch.

6. The noise-free switching circuit as defined in claim 5, wherein each switching element is a transistor whose emitter is said first terminal, whose collector is said second terminal, and whose base is said third control terminal.

7. The noise-free switching circuit as defined in claim 1, wherein said control means includes a DC power supply, and wherein said actuating switch is a manually-operated mechanical switch electrically connected to said DC power supply.

8. The noise-free switching circuit as defined in claim 1, wherein said control voltage generating means includes an exponential curve generating circuit which generates each control voltage with an amplitude versus time characteristic which increases and decreases in exponential manner, each exponentially increasing and decreasing voltage curve having the same time constant.

9. The noise-free switching circuit as defined in claim 8, wherein said exponential curve generating circuit includes a first resistor and a diode connected in parallel with each other, a second resistor connected between one end of said first resistor and ground, and a capacitor connected between the opposite end of said first resistor and ground.

10. The noise-free switching circuit as defined in claim 1, wherein said first circuit means, said second circuit means, and said switching means are all incorporated on a single integrated circuit chip.

11. The noise-free switching circuit as defined in claim 1; and further comprising a high impedance load connected between said output terminal and ground.

12. A noise-free method of electronically selecting between a pair of audio input signals in an audio system, comprising the steps of:
(a) establishing electrical communication along a first signal-bearing path between a first input terminal to which one of the audio input signals is applied, and an output terminal;
(b) establishing electrical communication along a second signal-bearing path between a second input terminal to which the other of the audio input signal is applied, and the same output terminal;
(c) electrically connecting a pair of actuatable switching elements each to a respective signal-bearing path, each switching element being actuatable between a pair of switched states in which transmission of the respective audio input signal along the respective path is permitted and prevented, respectively; and
(d) actuating the switching elements to permit transmission of a selected one of the audio input signals to the output terminal while preventing transmission of the other non-selected audio input signal to the output terminal, said actuating step including the steps of
  (i) providing an actuaing switch remote from the signal-bearing paths and having two operating conditions,
  (ii) generating in response to operation of said actuating switch a first control voltage having an amplitude versus time characteristic which increases in smooth continuous manner in one of said operating conditions and which correspondingly decreases in smooth continuous manner in the other of said operating conditions, and a second control voltage having an amplitude versus time characteristic which decreases in smooth continuous manner in said one operating condition and which correspondingly increases in smooth continuous manner in said other operating condition, said generating step including generating said first and said second control voltages substantially simultaneously and in inverse relationship with each other, and
  (iii) electrically connecting said control voltages to said switching elements so as to gradually begin to actuate one of the switching elements from one to the other of the switched states, and to simultaneously begin to gradually deactuate the other of the switching elements from said other to said one switched state to thereby permit transmission in a gradual noise-free manner of one of the audio input signals along its respective path in one of said operating conditions of said actuating switch, and to thereupon gradually begin to deactuate said one switching element from said other to said one switched state, and to simultaneously begin to gradually actuate said other switching element from said one to said other switched state to thereby permit transmission in a gradual nosie-free manner of the other of the audio input signals along its respective path in the other of said operating conditions of said actuating switch.

13. The noise-free method as defined in claim 12, wherein said step of generating said control voltages is performed by generating each control voltage with an amplitude versus time characteristic which increases and decreases in exponential manner, each exponentially increasing and decreasing voltage curve having the same time constant.

14. A noise-free switching circuit for electronically selecting between a pair of audio input signals in an audio system, comprising:
(a) first circuit means for establishing electrical communication along a first signal-bearing path between a first input terminal to which one of the audio input signals is applied, and an output terminal;
(b) second circuit means for establishing electrical communication along a second signal-bearing path between a second input terminal to which the other of the audio input signals is applied, and the same output terminal;
(c) switching means including a pair of actuatable switching elements each being in electrical communication with a respective circuit means, and each being actuatable between a pair of switched states in which transmission of the respective audio input signal along the respective path is permitted and prevented, respectively; and
(d) control means for actuating said switching elements to permit transmission of a selected one of the audio input signals to the output terminal while preventing transmission of the other non-selected audio input signal to the output terminal, said control means including
  (i) an actuating switch remote from said signal-bearing paths and having two operating conditions,
  (ii) means responsive to said actuating switch for generating a first control voltage having an amplitude versus time characteristic which increases in smooth continuous manner in one of said operating conditions and which correspondingly decreases in smooth continuous manner in the other of said operating conditions, and for generating a second control voltage having an amplitude versus time characteristic which decreases in smooth continuous manner in said one operating condition and which correspondingly increases in smooth continuous manner in said other operating condition, said control voltage generating means further including a DC power supply for generating a reference DC voltage, an exponential curve generating circuit for generating an expontential control voltage, a subtraction circuit having two inputs to which said reference DC voltage and said exponential control voltage is applied, and an output to which the difference between said reference DC voltage and said exponential control voltage is conducted, and
  (iii) means for electrically connecting said control voltages to said switching elements so as to actuate one of the switching elements from one to the other of said switched states, and the other of the switching elements from said other to said one switched state to thereby permit transmission in a gradual noise-free manner of one of the audio input signals along its respective path in one of said operating conditions of said actuating switch, and to thereupon actuate said one switching element from said other to said one switched state, and said other switching element from said one to said other switched state to thereby permit transmission in a gradual noise-free manner of the other of the audio input signals along its respective path in the other of said operating conditions of said actuating switch.

* * * * *